United States Patent [19]

Hawrylo

[11] 3,929,525

[45] Dec. 30, 1975

[54] METHOD OF FORMING OHMIC CONTACTS

[75] Inventor: Frank Zygmunt Hawrylo, Trenton, N.J.

[73] Assignee: RCA Corporation, New York, N.Y.

[22] Filed: June 10, 1974

[21] Appl. No.: 477,850

[52] U.S. Cl. .................. 148/171; 148/172; 29/571; 252/62.3 GA; 357/65

[51] Int. Cl.$^2$............................................ H01L 7/38

[58] Field of Search.................... 148/171, 172, 173; 117/201; 29/571; 252/62.3 GA; 357/65

[56] References Cited

UNITED STATES PATENTS

| | | | |
|---|---|---|---|
| 3,496,118 | 2/1970 | Willardson et al. | 252/62.3 GA |
| 3,560,275 | 2/1971 | Kressel et al. | 148/171 |
| 3,615,856 | 10/1971 | Sommers | 148/171 X |
| 3,696,262 | 10/1972 | Antypas | 148/171 X |

*Primary Examiner*—G. Ozaki

*Attorney, Agent, or Firm*—Glenn H. Bruestle; Daniel N. Calder

[57] ABSTRACT

A contact of an indium gallium arsenide alloy forms an ohmic contact with a body of n-type or p-type single crystal gallium arsenide of a resistivity of 1 ohm-cm or greater. The method for forming the contact utilizes a low temperature range. This low temperature range lessens the amount of surface disassociation and aids in the prevention of contamination of the body of gallium arsenide.

10 Claims, 2 Drawing Figures

METHOD OF FORMING OHMIC CONTACTS

BACKGROUND OF THE INVENTION

The present invention relates to an ohmic contact and a method of forming an ohmic contact and more specifically to forming an ohmic contact of an indium gallium arsenide alloy on a body of single crystal n-type or p-type gallium arsenide of high resistivity.

In the past, the methods for forming ohmic contacts to high resistivity gallium arsenide resulted in a variation of unwanted effects. Most of these unwanted effects were the result of depositing the contact mixture on the body of gallium arsenide at high temperatures. High temperature deposition causes greater surface disassociation of the gallium arsenide body and exaggerates the effect of the diffusion of impurities into the gallium arsenide body due to background contamination, at times causing a resistive interface. Excessive heating of a device is caused by a resistive interface. A resistive interface is a particularly serious problem in a Gunn oscillator where it can lower the oscillator's efficiency and vary its output frequency.

Therefore, it would be most desirable in the field of semiconductors to be capable of forming an ohmic contact on a body of n-type or p-type, high resistivity gallium arsenide at a low deposition temperature.

SUMMARY OF THE INVENTION

An ohmic contact and a method of making an ohmic contact on a body of single crystalline gallium arsenide. A solution is prepared in which gallium arsenide and a conductivity modifier are dissolved in indium so that the solution is saturated with gallium arsenide. The solution is brought into contact with the body of gallium arsenide, and then cooled so that an indium gallium arsenide alloy is deposited on the body.

DETAILED DESCRIPTION

Figure 1:
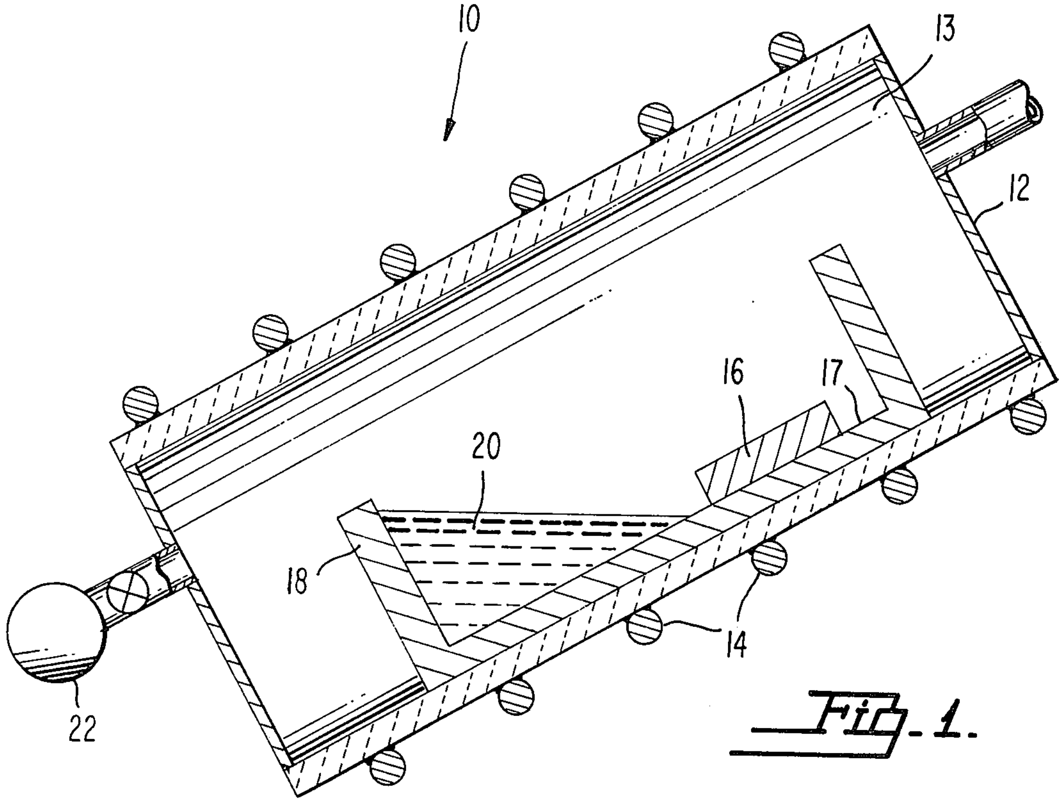
FIG. 1 is a cross-sectional view of an apparatus suitable for carrying out the method of the present invention.

Referring to FIG. 1, an apparatus suitable for carrying out the method of the present invention is generally designated as 10. The apparatus 10 comprises a furnace 12 with a chamber 13, the heating coils 14. The furnace 12 can be any furnace suitable for liquid phase epitaxy. A flat semiconductor substrate 16 of n-type gallium arsenide having a high resistivity, on the order of 1 ohm-cm or greater, is disposed on a floor 17 of a boat 18. The boat 18 is made of relatively chemically-inert refractory material, such as graphite.

Also, in the boat 18 is a solution 20, formed from a charge consisting of the components indium (In), gallium arsenide (GaAs) and an n-type conductivity modifier selected from the group tin, tellurium, and selenium. When the charge is heated to a proper temperature, the gallium arsenide and conductivity modifier will be dissolved in the indium solvent. The proportion of the components are such as to achieve saturation of gallium arsenide in the solution 20. An example of a proportion that will give this result is: 5 grams of indium, 175 milligrams of gallium arsenide and 50 milligrams of n-type conductivity modifier, preferably tin.

The component gallium arsenide must be saturated in the solution 20, so as to prevent the substrate 16 from dissolving when in contact with the solution 20. The n-type conductivity modifier is essential to the method of the present invention by assuring the solution 20 is of an n-type conductivity, thereby preventing a P-N junction at the interface of the fabricated ohmic contact and the substrate 16. A P-N junction at the contact-substrate interface would cause a potential energy barrier which would hinder current flow. A source 22 of reducing gas, such as hydrogen, is connected to the inlet of the furnace 12.

To carry out the method of the present invention, the boat 18 with constituent components of the charge is placed into the chamber 13. The charge is heated to a temperature of 600°C. in the chamber 13 by the coils 14, in a manner well known in the art. A stream of reducing gas is passed through the chamber 13, during the heating of the charge. The reducing gas provides a nonoxidizing and cleaning ambient for the reactions which occur in the chamber 13. At the temperature of about 600°C. the charge forms an homogenized solution 20, that is, its constituent components are equally distributed throughout the solution 20. The solution 20 is then cooled to room temperature forming a solid homogenized solution 20. Before the solution 20 is cooled to room temperature, the furnace 12 is tilted so that the solution 20 is at one end of the boat 18, as shown in the drawing.

After the solid solution 20 is formed, the substrate 16 is disposed firmly on the floor 17 of the boat 18, at the end opposite the solution 20. The substrate 16 is disposed on the floor 17 by any suitable means. If the substrate 16 is to be used as a laser device, the surface opposite the floor 17 should be oriented in a suitable plane such as a (100) crystal plane so that the laser device can then be cleaved at right angles to provide parallel mirror planes.

Next, the boat 18 and its contents are heated to a temperature in the range of 450°C. to 550°C. with a stream of reducing gas passing through the chamber 13, to provide a nonoxidizing and clean ambient during heating.

When the contents of the boat 18 reach a temperature between 450°C. to 550°C., furnace 12 is tilted, clockwise looking at the drawing, so that the solution 20 is disposed over the substrate 16. The heating of the chamber 13 is now discontinued, and the solution 20 is allowed to cool to a temperature of about 400°C. During this cooling period, a conductive indium gallium arsenide alloy layer is precipitated onto the substrate 16.

After the layer of indium gallium arsenide alloy has been precipitated onto the substrate 16, the furnace 12 is tilted back to its original position, in which the substrate 16 is at one end of the boat 18 and the solution 20 at the other end. Therefore, tilting back the furnace 12 to its original position removes the bulk of the solution 20 from the substrate 16.

State of the art cleaning and lapping techniques are then performed on the as-grown indium gallium arsenide alloy layer as preparation for the growth of an indium gallium arsenide alloy layer on the opposite surface of the substrate 16.

The substrate 16 is then placed into the boat 18 so that the indium gallium arsenide alloy layer is in contact with floor 17 and the deposition procedure is repeated. The substrate 16 now has on both surfaces a layer of indium gallium arsenide alloy. Electrical contact to the ohmic contact is made by metalization on the indium gallium arsenide alloy layer.

While the preceding description of the method of the present invention has been detailed for an n-type gallium arsenide substrate, the present method can also be utilized in the forming of an ohmic contact on a substrate of p-type gallium arsenide. When an ohmic contact is to be formed on a p-type gallium arsenide substrate, a p-type conductivity modifier is to be used, preferably zinc. An example of the proportion of components constituting the charge is: 5 grams of indium, 175 milligrams of gallium arsenide and 10 milligrams of zinc.

A sliding boat, as described in U.S. Pat. No. 3,565,702, issued Feb. 23, 1971 to H. Nelson, can also be used in the method of fabricating an ohmic contact of the present invention.

By using the method of fabricating ohmic contacts of the present invention, the substrate 16, is exposed to low temperatures, in the range of 450°C. to 550°C. These low temperatures minimize the molecular disassociation on the substrate's surfaces. Typically, for gallium arsenide surface disassociation noticeably occurs at approximately 600°C. to 650°C. If higher temperatures were used in the present invention, impurities due to contamination in the chamber 13 could be attracted to the substrate 16, causing, for example a resistive interface with the ohmic contact. In addition, when high temperatures are used in the fabrication of ohmic contacts, impurities in the substrate 16 can also move through the substrate 16 causing perturbations. In gallium arsenide substrates, copper impurities are always present, thus increasing the probability of forming perturbated type regions such as a resistive interface. A resistive interface between the substrate 16 and an ohmic contact will often cause excessive heating of the device, particularly in a Gunn oscillator where a resistive interface will lower the operating efficiency.

Figure 2:
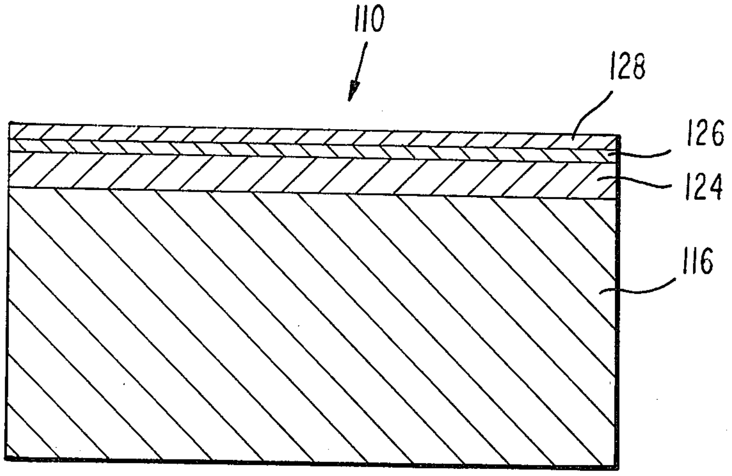
FIG. 2 is a cross-sectional view of the ohmic contact of the present invention.

Referring to FIG. 2, a semiconductor device 110 having the ohmic contact formed by the previously described method consists of an intermediate layer of an indium gallium arsenide alloy 124 on a surface of a body of single crystal, high resistivity gallium arsenide 116, and a first metal layer 126 of good conductivity on the alloy layer 124, and a second metal layer 128 of good conductivity on the metal layer 126. The body of gallium arsenide 116 is the same as the substrate 16 in FIG. 1. After the indium gallium arsenide alloy layer 124 is formed, it is prepared for the metallization by being cleaned, lapped and etched chemically. Through the use of deposition techniques well known in the art, the first metallic layer 126 is formed on the indium gallium arsenide layer 124 and the second metallic layer 128 is formed on the first metal layer 126. First metal layer 126 is typically of nickel, and second metal layer 128 is typically of gold.

Thus, there is provided by the present invention a method of fabricating an ohmic contact, which prevents many unwanted effects associated with high temperature ohmic contact fabrication, and the ohmic contact formed.

I claim:

1. A method of providing an ohmic contact on a semiconductor body comprising:

preparing a solution in which gallium arsenide and a conductivity modifier are dissolved in indium such that the solution is saturated with said gallium arsenide;

contacting said solution to a body of single crystal gallium arsenide of high resistivity; and cooling said solution such that an indium gallium arsenide alloy is deposited on said body of single crystal gallium arsenide.

2. The method of making an ohmic contact in accordance with claim 1 in which said body of single crystal gallium arsenide has a resistivity of 1 ohmcentimeter or greater.

3. The method of making an ohmic contact in accordance with claim 2 in which said body of single crystal gallium arsenide is of an n-type conductivity.

4. The method of making an ohmic contact in accordance with claim 3 in which said solution is prepared from a charge in proportions consisting essentially of about 5 grams of indium, about 175 milligrams of gallium arsenide and about 50 milligrams of an n-type conductivity modifier selected from the group consisting of tin, tellurium, and selenium.

5. The method of making an ohmic contact in accordance with claim 4 in which said charge is heated to about 600°C. to form said solution, which is homogenized.

6. The method of making an ohmic contact in accordance with claim 5 in which said solution is cooled to about room temperature to form a solid solution.

7. The method of making an ohmic contact in accordance with claim 6 in which said solid solution is heated in the range of 450° to 550°C.

8. The method of making an ohmic contact in accordance with claim 7 in which said solution is cooled to about 400°C. for the deposition of an indium gallium arsenide alloy on a surface of said body.

9. The method of making an ohmic contact in accordance with claim 2 in which said body of single crystal gallium arsenide is of a p-type conductivity.

10. The method of making an ohmic contact in accordance with claim 9 in which said solution is prepared from a charge in proportions consisting essentially of about 5 grams of indium, about 175 milligrams of gallium arsenide and about 10 milligrams of zinc.

* * * * *